(12) United States Patent
Fang (10) Patent No.: US 11,147,159 B2
(45) Date of Patent: Oct. 12, 2021

(54) DISPLAY MODULE AND DISPLAY DEVICE

(71) Applicant: Wuhan China Star Optoelectronics Semiconductor Display Technology Co., Ltd., Hubein (CN)

(72) Inventor: Hong Fang, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 16/840,519

(22) Filed: Apr. 6, 2020

(65) Prior Publication Data

US 2021/0100092 A1    Apr. 1, 2021

(30) Foreign Application Priority Data

Sep. 27, 2019 (CN) .......................... 201910921279.X (51) Int. Cl.
*H05K 1/02* (2006.01)
*H05K 1/11* (2006.01)
(Continued)

(52) U.S. Cl.
CPC ......... *H05K 1/0277* (2013.01); *H05K 1/0266* (2013.01); *H05K 1/115* (2013.01); *H05K 5/0017* (2013.01); *G09G 5/14* (2013.01); *G09G 2310/0275* (2013.01); *G09G 2380/02* (2013.01); *H04N 5/2257* (2013.01); *H05K 2201/056* (2013.01)

(58) Field of Classification Search
CPC .... H05K 1/0277; H05K 1/0266; H05K 1/115; H05K 5/0017; H05K 2201/056; G09G 5/14; H04N 5/2257
USPC ........................................................ 396/296
See application file for complete search history.

(56) References Cited

U.S. PATENT DOCUMENTS 10,651,120 B1 * 5/2020 Tsai ..................... H01L 51/0097
10,742,784 B1 * 8/2020 Jo ........................ H04M 1/0239
(Continued)

FOREIGN PATENT DOCUMENTS

CN       104216164 A    12/2014
CN       107682489 A    2/2018
(Continued)

*Primary Examiner* — Hoa C Nguyen
(74) *Attorney, Agent, or Firm* — The Roy Gross Law Firm, LLC; Roy Gross (57) ABSTRACT

A display module and a display device are provided. The display device includes a display panel, a fixing member, and a control unit. The display panel includes a first display region and a second display region connected by a bending region. The fixing member fixes the second display region and guides the second display region corresponding to the first display region to move. Furthermore, a first via hole is formed in an electronic element disposing region of the display panel. Because of the first via hole on the display panel, an electronic element such as a camera, etc. is disposed under the display panel to realize full screen technology such as an under-display camera, etc. Meanwhile, because of the second display region, it can be realized that a region corresponding to the first via hole can still functionally display when the electronic elements are not in operation.

10 Claims, 5 Drawing Sheets

(51) Int. Cl.
   *H05K 5/00* (2006.01)
   *G09G 5/14* (2006.01)
   *H04N 5/225* (2006.01)

(56) References Cited

U.S. PATENT DOCUMENTS

| | | | |
|---|---|---|---|
| 2003/0218710 A1 | 11/2003 | Hong | |
| 2017/0104855 A1* | 4/2017 | Lee | H04B 1/72 |
| 2017/0338294 A1* | 11/2017 | Choi | H01L 27/3276 |
| 2018/0102072 A1* | 4/2018 | Lee | G06F 3/147 |
| 2019/0268455 A1* | 8/2019 | Baek | G06F 1/1681 |
| 2020/0008308 A1* | 1/2020 | Shin | G09F 9/301 |
| 2020/0153069 A1* | 5/2020 | Birmingham | H01M 6/36 |
| 2020/0170114 A1* | 5/2020 | Choi | G09F 9/301 |
| 2020/0372850 A1* | 11/2020 | He | G06F 1/16 |
| 2021/0041916 A1 | 2/2021 | Zhang et al. | |
| 2021/0124625 A1* | 4/2021 | Noh | G06F 9/5094 |
| 2021/0135151 A1* | 5/2021 | Baek | H04N 5/2257 |
| 2021/0135492 A1* | 5/2021 | Kim | H01Q 1/38 |

FOREIGN PATENT DOCUMENTS

| | | |
|---|---|---|
| CN | 108335630 A | 7/2018 |
| CN | 108563286 A | 9/2018 |
| CN | 108616624 A | 10/2018 |
| CN | 108924296 A | 11/2018 |
| CN | 110133890 A | 8/2019 |

\* cited by examiner

DISPLAY MODULE AND DISPLAY DEVICE

FIELD OF INVENTION

The present disclosure relates to the field of display technologies, and particularly relates to a display module and a display device.

BACKGROUND OF INVENTION

With the development of full screen technology, technology of disposing electronic elements under a display panel, such as an under-display camera, etc. is a developing trend. In the prior art, in order to ensure lighting effect of electronic elements such as under-display cameras, film layers above the cameras need to be removed to form via holes, that is hole punching technology. However, after via holes are punched, images cannot be displayed on positions of via holes formed by punching.

Therefore, current full screen technology has a technical problem that images cannot be displayed on the positions where the hole is punched, and it needs to be improved.

SUMMARY OF INVENTION

A display module and a display device are provided by the present disclosure to solve the technical problems that current full screen technology has mages cannot be displayed on the hole punching position.

In order to solve the problems mentioned above, the technical solutions provide by the present disclosure are as follows:

A display module provided by an embodiment of the present disclosure includes:

A display panel, which includes a first display region and a second display region connected by a bending region.

A fixing member, which is used to fix the second display region and to guide the second display region corresponding to the first display region to move.

Furthermore, a first via hole is formed in an electronic element disposing region of the display panel. At least part of the first display region is in contact with the electronic element disposing region. A display area of the second display region is not less than an area of the electronic element disposing region and is fixed on the fixing member by the bending region after it is bent.

In the display module of an embodiment provided by the present disclosure, the fixing member includes a fixing chute and a pushing/pulling mechanism. The second display region is fixed in the fixing chute. The pushing/pulling mechanism is used to push or pull the second display region to guide the second display region corresponding to the first display region to move.

In the display module of an embodiment provided by the present disclosure, the fixing member includes a first supporting shaft and a second supporting shaft. The second display region is fixed on the first supporting shaft and the second supporting shaft. The first supporting shaft rotates and the second supporting shaft translates to guide the second display region corresponding to the first display region to move.

In the display module of an embodiment provided by the present disclosure, the first supporting shaft is connected to the second display region by a transparent film material.

In the display module of an embodiment provided by the present disclosure, a second via hole is formed on the bending region of the display panel.

In the display module of an embodiment provided by the present disclosure, a signal line connected to the second display region is disposed on an edge of the bending region.

In the display module of an embodiment provided by the present disclosure, the signal line includes at least one of a gate scanning line, a data line, a power line, or a grounding line.

In the display module of an embodiment provided by the present disclosure, a first alignment mark is disposed on the first display region, and a second alignment mark is disposed on the second display region.

In the display module of an embodiment provided by the present disclosure, the first alignment mark includes a first display alignment terminal and a first non-display alignment terminal, and the second alignment mark includes a second display alignment terminal and a second non-display alignment terminal.

Meanwhile, an embodiment of the present disclosure provides a display device, which includes an electronic element and the display module mentioned above, wherein:

A display panel includes a first display region and a second display region connected by the bending region. A first via hole is formed in an electronic element disposing region of the display panel. At least part of the first display region is in contact with the electronic element disposing region. A display area of the second display region which is not less than an area of the electronic element disposing region.

A fixing member is used to fix the second display region and to guide the second display region corresponding to the first display region to move, and the second display region is fixed on the fixing member by the bending region after it is bent.

An electronic element is disposed under the first display region and the second display region.

Furthermore, when the electronic element is working, the fixing member guides the second display region corresponding to the first display region to move to expose the first via hole. When the electronic element is not working, the fixing member guides the second display region corresponding to the first display region to move to cover the first via hole and controls the second display region to work.

The beneficial effect of the present disclosure is that the present disclosure provides a display module and a display device. The display device includes a display panel, a fixing member, and a control unit. The display panel includes a first display region and a second display region connected by a bending region. The fixing member fixes the second display region and guides the second display region corresponding to the first display region to move. Furthermore, a first via hole is formed in an electronic element disposing region of the display panel, at least part of the first display region is in contact with the electronic element disposing region, and a display area of the second display region is not less than an area of the electronic element disposing region and is fixed on the fixing member by the bending region after it is bent. Because of the first via hole on the display panel, the electronic elements such as a camera, etc. is disposed under the display panel to realize full screen technology such as an under-display camera, etc. Meanwhile, because of the second display region, it can be realized that a region corresponding to the first via hole can still functionally display when the electronic elements are not in operation. This truly realizes a full screen display and solves the technical problem in current full screen technology that images cannot be displayed on a hole punching position.

DESCRIPTION OF DRAWINGS

In order to more clearly illustrate embodiments or the technical solutions of the present disclosure, the accompanying figures of the present disclosure required for illustrating embodiments or the technical solutions of the present disclosure will be described in brief. Obviously, the accompanying figures described below are only part of the embodiments of the present disclosure, from which those skilled in the art can derive further figures without making any inventive efforts.

DETAILED DESCRIPTION OF PREFERRED EMBODIMENTS

The descriptions of embodiments below refer to accompanying drawings in order to illustrate certain embodiments which the present disclosure can implement. The directional terms of which the present disclosure mentions, for example, "top", "bottom", "upper", "lower", "front", "rear", "left", "right", "inside", "outside", "side", etc., are just refer to directions of the accompanying figures. Therefore, the used directional terms are for illustrating and understanding the present disclosure, but not for limiting the present disclosure. In the figures, units with similar structures are indicated by the same reference numerals.

Aiming at the technical problem that images cannot be displayed on a hole punching position, embodiments of the present disclosure can solve the technical problem.

Figure 1:
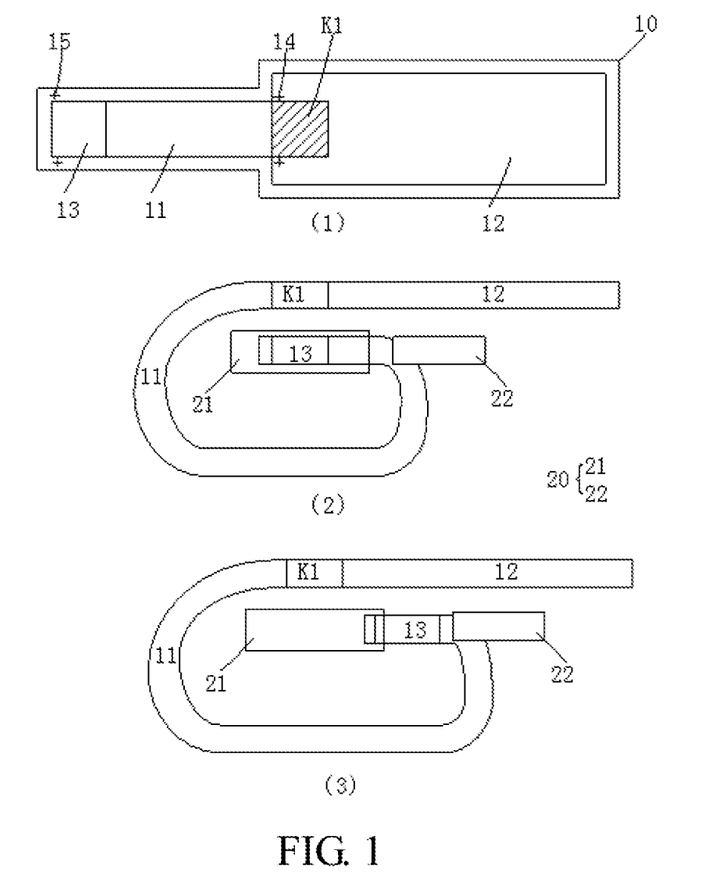
FIG. 1 is a first schematic diagram of a display module provided by an embodiment of the present disclosure.
Figure 2:
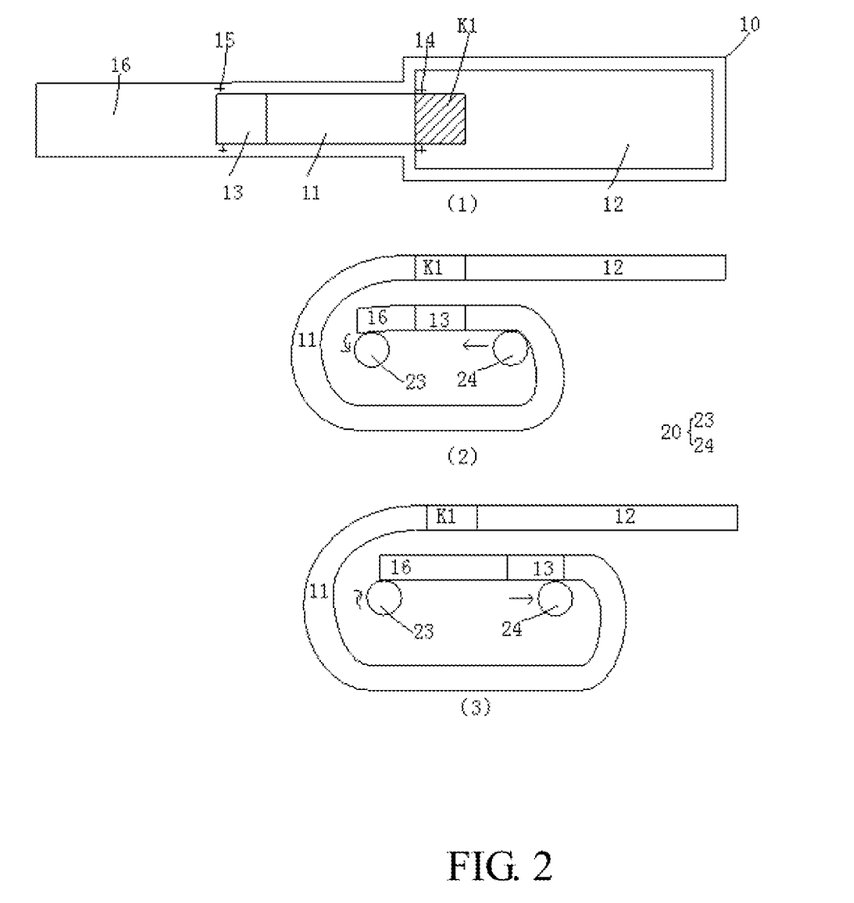
FIG. 2 is a second schematic diagram of the display module provided by an embodiment of the present disclosure.
Figure 3:
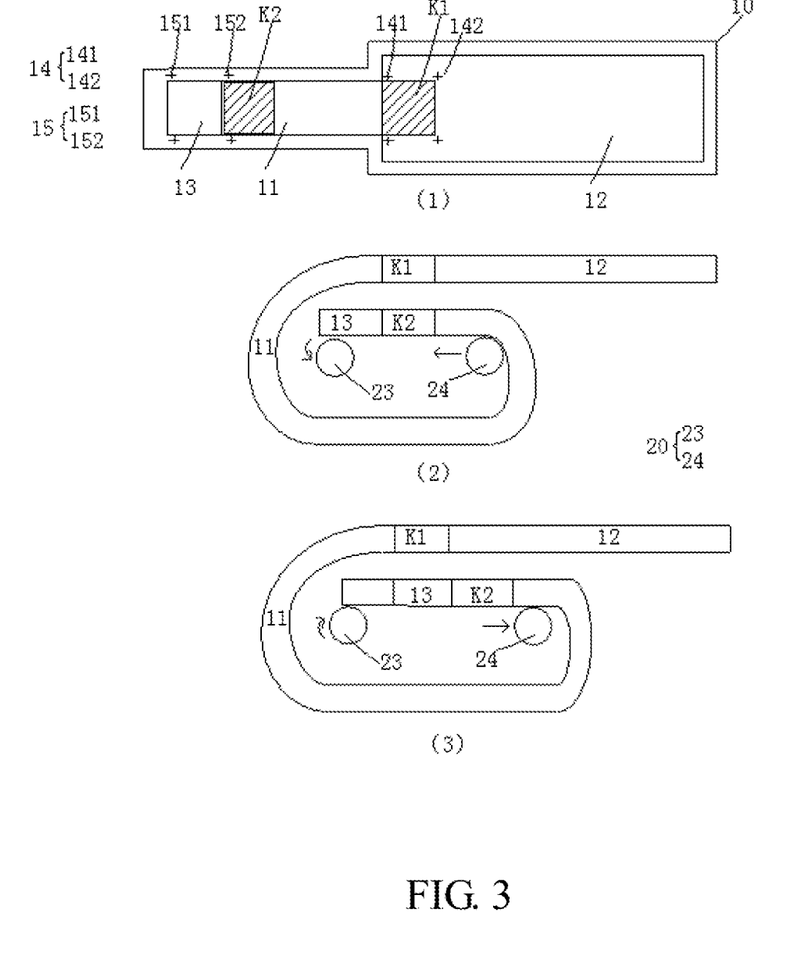
FIG. 3 is a third schematic diagram of the display module provided by an embodiment of the present disclosure.

In an embodiment, as illustrated in FIG. 1 to FIG. 3, a display module provided by an embodiment of the present disclosure includes:

A display panel 10, which includes a first display region 12 and a second display region 13 connected by a bending region 11.

A fixing member 20, which is used to fix the second display region 13 and guides the second display region 13 corresponding to the first display region 12 to move.

A control unit (not shown in FIG. 1 to FIG. 3), which is used to control the second display region 13 and the fixing member 20 to work.

Furthermore, a first via hole K1 is formed in an electronic element disposing region of the display panel 10. At least part of the first display region 12 is in contact with the electronic element disposing region (the first via hole K1). A display area of the second display region 13 is not less than an area of the electronic element disposing region (the first via hole K1) and is fixed on the fixing member 20 by the bending region 11 after it is bent.

This embodiment provides a display module. The display module includes a display panel, a fixing member, and a control unit. Because of the first via hole on the display panel, the present disclosure can dispose the electronic element such as a camera, etc. under the display panel to realize full screen technology such as an under-display camera, etc. Meanwhile, because of the second display region, it can be realized that a region corresponding to the first via hole can still functionally display when the electronic elements are not in operation. This truly realizes a full screen display and solves the technical problem in current full screen technology that images cannot be displayed on a hole punching position.

In an embodiment, a signal line connected to the second display region is disposed on an edge of the bending region.

In an embodiment, the signal line includes at least one of a gate scanning line, a data line, a power line, or a grounding line.

In an embodiment, the signal line includes a gate scanning line, a data line, a power line, or a grounding line.

In an embodiment, the signal line includes a data line, a power line, or a grounding line. The gate driving circuit corresponding to the second display region, which is a gate on array (GOA) circuit, is disposed on an edge of the bending region.

In an embodiment, as illustrated in FIG. 1, a first alignment mark 14 is disposed on the first display region 12, and a second alignment mark 15 is disposed on the second display region 13.

In the present disclosure, the display module includes a full-screen display mode when the electronic element is not working and a non-full-screen display mode when the electronic element is working, and at this time, the region corresponding to the first via hole K1 does not display. Therefore, the alignment marks need to realize alignment of the first display region and the second display region in the two modes. Because alignment accuracy requirements of the first display region and the second display region in the full-screen display mode are high, only one first alignment mark 14 and only one second alignment mark 15 can be disposed to realize accurate alignment of the first display region and the second display region in the full-screen display mode, and in the non-full-screen display mode, it only depends on the fixing member 20 itself to restrict positions.

In an embodiment, as illustrated in FIG. 3, the first alignment mark 14 includes a first display alignment terminal 141 and a first non-display alignment terminal 142, and the second alignment mark 15 includes a second display alignment terminal 151 and a second non-display alignment terminal 152. The first display alignment terminal 141 and the second display alignment terminal 151 realize accurate alignment of the first display region and the second display region in the full-screen display mode, and the first non-display alignment terminal 142 and the second non-display alignment terminal 152 realize accurate alignment of the first display region and the second display region in the non-full-screen display mode.

In an embodiment, the fixing member 20 includes a charge-coupled device (CCD) camera. The CCD camera can sense the alignment marks inside film layers.

In an embodiment, the first alignment mark and the second alignment mark can be patterned and be formed from at least one of an active layer, a metal light shielding layer, a gate electrode layer, or a source/drain electrode layer which are inside the display panel.

In an embodiment, the first alignment mark and the second alignment mark can be disposed on a same layer or can be disposed on different layers.

In an embodiment, shapes of the first alignment mark and the second alignment mark are one or more of cross, rhombic, rectangular, circular, or square.

In an embodiment, the electronic element includes one or more of a camera, an optical fingerprint sensor, or a light sensor.

In an embodiment, the electronic element disposing region is a region where lighting path of the electronic element passes through, and it can be a circular shape, a rectangular shape, etc.

In an embodiment, the control unit can be realized independently by a source electrode driving chip corresponding to the display panel. At this time, the source electrode driving chip simultaneously controls the first display region, the second display region, and the fixing member to work. Specifically, the source electrode driving chip determines whether the electronic element works by obtaining instruction from a main control central processing unit (CPU) of the display device. When the electronic element is working, the source electrode driving chip controls the fixing member to guide the second display region corresponding to the first display region to move to expose the first via hole. When the electronic element is not working, the source electrode driving chip controls the fixing member to guide the second display region corresponding to the first display region to move to cover the first via hole and controls the second display region to work.

In an embodiment, the control unit can be realized by coordination of a plurality of driving chips. For example, the control unit includes a fixing member driving chip and a source electrode driving chip. The source electrode driving chip simultaneously controls the first display region and the second display region to work. The fixing member driving chip controls the fixing member to work. The source electrode driving chip determines whether the electronic element works by obtaining instruction from a main control CPU of the display device. When the electronic element is working, the source electrode driving chip controls the second display region not to work. When the electronic element is not working, the source electrode driving chip controls the second display region to work. The fixing member driving chip determines whether the electronic element works by obtaining instruction from the main control CPU of the display device. When the electronic element is working, the fixing member driving chip controls the fixing member to guide the second display region corresponding to the first display region to move to expose the first via hole. When the electronic element is not working, the fixing member driving chip controls the fixing member to guide the second display region corresponding to the first display region to move to cover the first via hole. Here is another example. The control unit includes a fixing member driving chip, a first source electrode driving chip, and a second source electrode driving chip. The first source electrode driving chip controls the first display region. The second source electrode driving chip controls the second display region to work. The fixing member driving chip controls the fixing member to work. The second source electrode driving chip determines whether the electronic element works by obtaining instruction from a main control CPU of the display device. When the electronic element is working, the second source electrode driving chip controls the second display region not to work. When the electronic element is not working, the source electrode driving chip controls the second display region to work. The fixing member driving chip determines whether the electronic element works by obtaining instruction from the main control CPU of the display device. When the electronic element is working, the fixing member driving chip controls the fixing member to guide the second display region corresponding to the first display region to move to expose the first via hole. When the electronic element is not working, the fixing member driving chip controls the fixing member to guide the second display region corresponding to the first display region to move to cover the first via hole.

In an embodiment, as illustrated in FIG. 1, a display module provided by an embodiment of the present disclosure includes:

A display panel 10, as illustrated in (1) of FIG. 1, which includes a first display region 12 and a second display region 13 connected by a bending region 11.

A fixing member 20, which is used to fix the second display region 13 and guide the second display region 13 corresponding to the first display region 12 to move. As illustrated in (2) of FIG. 1, the fixing member 20 includes a fixing chute 21 and a pushing/pulling mechanism 22. The second display region is fixed in the fixing chute 21. The pushing/pulling mechanism 22 is used to push or pull the second display region to translate in the fixing chute 21 to guide the second display region corresponding to the first display region to move.

A control unit (not shown in FIG. 1), which is used to control the second display region 13 and the fixing member 20 to work.

Specifically, as illustrated in (2) of FIG. 1, when the electronic element is not working, the pushing/pulling mechanism 22 pushes the second display region to translate in the fixing chute 21, and the second display region covers the first via hole to realize full screen display. As illustrated in (3) of FIG. 1, when the electronic element is working, the pushing/pulling mechanism 22 pulls the second display region to translate in the fixing chute 21, and the second display region does not block a lighting path of the electronic element.

In an embodiment, as illustrated in FIG. 2, a display module provided by an embodiment of the present disclosure includes:

A display panel 10, as illustrated in (1) of FIG. 2, which includes a first display region 12 and a second display region 13 connected by a bending region 11, and a transparent film material 16.

A fixing member 20, which is used to fix the second display region 13 and to guide the second display region 13 corresponding to the first display region 12 to move. As illustrated in (2) of FIG. 2, the fixing member 20 includes a first supporting shaft 23 and a second supporting shaft 24. The second display region 13 is fixed on the first supporting shaft 23 and the second supporting shaft 24. The first supporting shaft 23 rotates and the second supporting shaft 24 translates so as to guide the second display region 13 corresponding to the first display region 12 to move.

A control unit (not shown in FIG. 2), which is used to control the second display region 13 and the fixing member 20 to work.

Specifically, as illustrated in (2) of FIG. 2, the first supporting shaft 23 is connected to the second display region 13 by a transparent film material 16. As illustrated in (2) of FIG. 2, when electronic element is not working, the first supporting shaft 23 curls toward inside, the second supporting shaft 24 translates left so as to guide the second display region 13 to move left to enter an area above the electronic element to realize full screen display. As illustrated in (3) of FIG. 2, when electronic element is working, the second supporting shaft 24 translates right, the first supporting shaft 23 curls toward outside so as to guide the second display region 13 to move right, and the transparent film material 16 enters an area above the electronic element and does not affect lighting of the electronic element.

In an embodiment, as illustrated in FIG. 3, a display module provided by an embodiment of the present disclosure includes:

A display panel 10, as illustrated in (1) of FIG. 3, which includes a first display region 12 and a second display region 13 connected by a bending region 11. A second via hole K2 is formed on the bending region of the display panel.

A fixing member 20, which is used to fix the second display region 13 and to guide the second display region 13 corresponding to the first display region 12 to move. As illustrated in (2) of FIG. 3, the fixing member 20 includes a first supporting shaft 23 and a second supporting shaft 24. The second display region 13 is fixed on the first supporting shaft 23 and the second supporting shaft 24. The first supporting shaft 23 rotates and the second supporting shaft 24 translates to guide the second display region 13 corresponding to the first display region 12 to move.

A control unit (not shown in FIG. 3), which is used to control the second display region 13 and the fixing member 20 to work.

Specifically, as illustrated in (2) of FIG. 3, the first supporting shaft 23 is connected to the second display region 13. As illustrated in (2) of FIG. 3, when electronic element is working, the first supporting shaft 23 curls toward inside, the second supporting shaft 24 translates left until the first via hole K1 and the second via hole K2 overlap each other above the electronic element, and this does not affect lighting of the electronic element. As illustrated in (3) of FIG. 3, when electronic element is not working, the second supporting shaft 24 translates right, and the first supporting shaft 23 curls toward outside to guide the second display region 13 to move right to enter an area above the electronic element to realize full screen display.

In an embodiment, the present disclosure provides a display device, which includes an electronic element and the display module mentioned above, wherein A display panel includes a first display region and a second display region connected by the bending region. A first via hole is formed in an electronic element disposing region of the display panel. At least part of the first display region is in contact with the electronic element disposing region. A display area of the second display region is not less than an area of the electronic element disposing region.

A fixing member is used to fix the second display region and to guide the second display region corresponding to the first display region to move, and the second display region is fixed on the fixing member by the bending region after it is bent.

A control unit is used to control the second display region and the fixing member to work.

An electronic element is disposed under the first display region and the second display region.

Furthermore, the control unit is used during the electronic element working to control the fixing member to guide the second display region corresponding to the first display region to move to expose the first via hole, and when the electronic element is not working, the control unit is also used to control the fixing member to guide the second display region corresponding to the first display region to move to cover the first via hole and controls the second display region to work.

In an embodiment, a signal line connected to the second display region is disposed on an edge of the bending region.

In an embodiment, the signal line includes at least one of a gate scanning line, a data line, a power line, or a grounding line.

In an embodiment, a first alignment mark is disposed on the first display region, and a second alignment mark is disposed on the second display region.

In an embodiment, the first alignment mark includes a first display alignment terminal and a first non-display alignment terminal, and the second alignment mark includes a second display alignment terminal and a second non-display alignment terminal.

Figure 4:
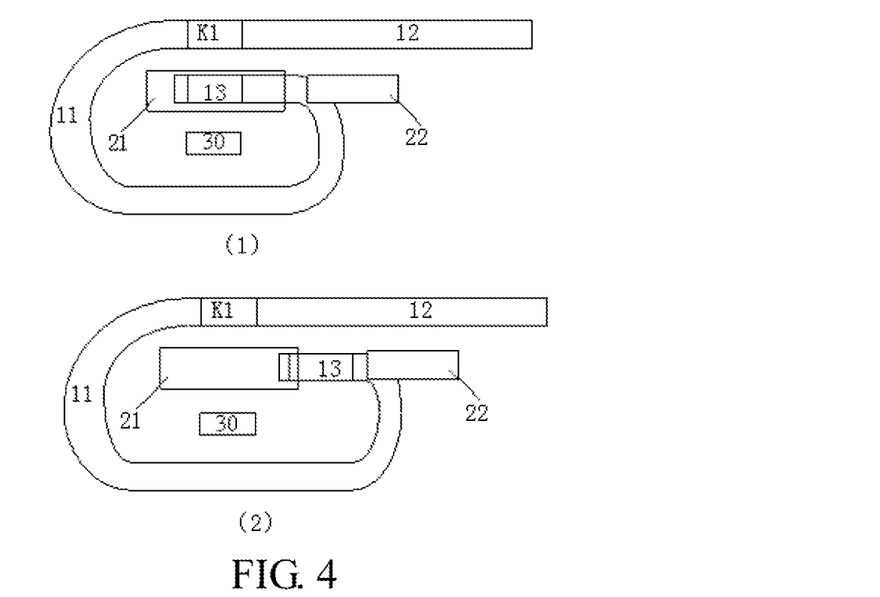
FIG. 4 is a first schematic diagram of a display device provided by an embodiment of the present disclosure.

In an embodiment, as illustrated in FIG. 4, a display device provided by an embodiment of the present disclosure includes:

A display panel 10, which includes a first display region 12 and a second display region 13 connected by a bending region 11.

A fixing member 20, which is used to fix the second display region 13 and to guide the second display region 13 corresponding to the first display region 12 to move. The fixing member 20 includes a fixing chute 21 and a pushing/pulling mechanism 22. The second display region is fixed in the fixing chute 21. The pushing/pulling mechanism 22 is used to push or pull the second display region to translate in the fixing chute 21 to guide the second display region corresponding to the first display region to move.

A control unit (not shown in FIG. 4), which is used to control the second display region 13 and the fixing member 20 to work.

An electronic element 30, which is disposed under the first display region and the second display region.

Specifically, as illustrated in (1) of FIG. 4, when the electronic element is not working, the pushing/pulling mechanism 22 pushes the second display region to translate in the fixing chute 21, and the second display region covers the first via hole to realize full-screen display. As illustrated in (2) of FIG. 4, when the electronic element is working, the pushing/pulling mechanism 22 pulls the second display region to translate in the fixing chute 21, and the second display region does not block a lighting path of the electronic element.

Figure 5:
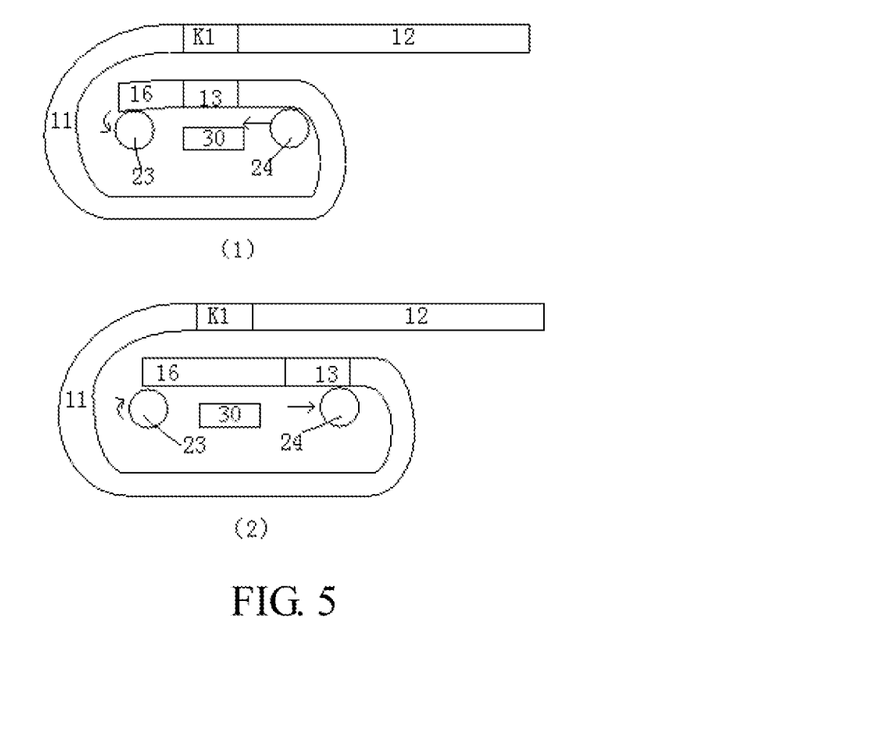
FIG. 5 is a second schematic diagram of the display device provided by an embodiment of the present disclosure.

In an embodiment, as illustrated in FIG. 5, a display device provided by an embodiment of the present disclosure includes:

A display panel 10, which includes a first display region 12 and a second display region 13 connected by a bending region 11, and a transparent film material 14.

A fixing member 20, which is used to fix the second display region 13 and to guide the second display region 13 corresponding to the first display region 12 to move. The fixing member 20 includes a first supporting shaft 23 and a second supporting shaft 24. The second display region 13 is fixed on the first supporting shaft 23 and the second supporting shaft 24. The first supporting shaft 23 rotates and the second supporting shaft 24 translates so as to guide the second display region 13 corresponding to the first display region 12 to move.

A control unit (not shown in FIG. 5), which is used to control the second display region 13 and the fixing member 20 to work.

An electronic element 30, which is disposed under the first display region and the second display region.

Specifically, as illustrated in (1) of FIG. 5, the first supporting shaft 23 is connected to the second display region 13 by a transparent film material 16. As illustrated in (1) of FIG. 5, when electronic element is not working, the first supporting shaft 23 curls toward inside, and the second supporting shaft 24 translates left to guide the second display region 13 to move left to enter an area above the electronic element to realize full screen display. As illustrated in (2) of FIG. 5, when electronic element is working, the second supporting shaft 24 translates right, the first supporting shaft 23 curls toward outside to guide the second display region 13 to move right, and the transparent film material 16 enters an area above the electronic element and does not affect lighting of the electronic element.

Figure 6:
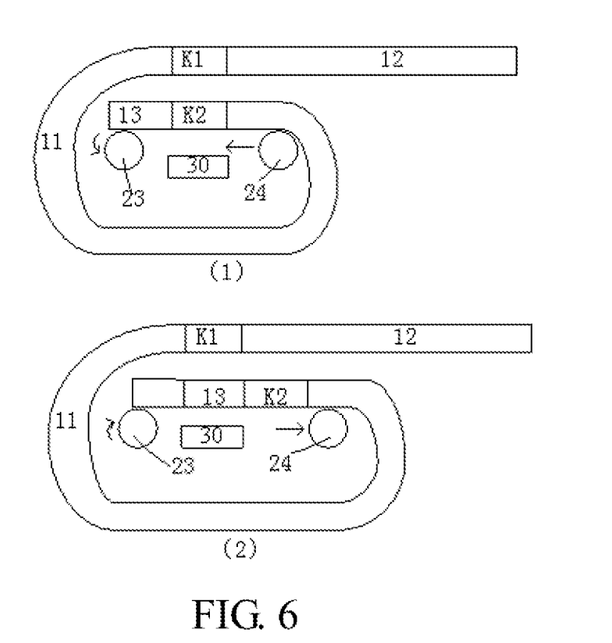
FIG. 6 is a third schematic diagram of the display device provided by an embodiment of the present disclosure.

In an embodiment, as illustrated in FIG. 6, a display device provided by an embodiment of the present disclosure includes:

A display panel 10, which includes a first display region 12 and a second display region 13 connected by a bending region 11. A second via hole K2 is formed on the bending region of the display panel.

A fixing member 20, which is used to fix the second display region 13 and to guide the second display region 13 corresponding to the first display region 12 to move. The fixing member 20 includes a first supporting shaft 23 and a second supporting shaft 24. The second display region 13 is fixed on the first supporting shaft 23 and the second supporting shaft 24. The first supporting shaft 23 rotates and the second supporting shaft 24 translates so as to guide the second display region 13 corresponding to the first display region 12 to move.

A control unit (not shown in FIG. 6), which is used to control the second display region 13 and the fixing member 20 to work.

An electronic element 30, which is disposed under the first display region and the second display region.

Specifically, as illustrated in (1) of FIG. 6, the first supporting shaft 23 is connected to the second display region 13. As illustrated in (1) of FIG. 6, when electronic element is working, the first supporting shaft 23 curls toward inside, the second supporting shaft 24 translates left to guide the second display region 13 to move left until the first via hole K1 and the second via hole K2 overlap each other above the electronic element, and this does not affect lighting of the electronic element. As illustrated in (2) of FIG. 6, when electronic element is not working, the second supporting shaft 24 translates right, and the first supporting shaft 23 curls toward outside to guide the second display region 13 to move right to guide the second display region 13 to move right to enter an area above the electronic element to realize full screen display.

According to embodiments mentioned above:

The present disclosure provides a display module and a display device. The display device includes a display panel, a fixing member, and a control unit. The display panel includes a first display region and a second display region connected by a bending region. The fixing member fixes the second display region and guides the second display region corresponding to the first display region to move. The control unit is used to control the second display region and the fixing member to work. Furthermore, a first via hole is formed in an electronic element disposing region of the display panel. At least part of the first display region is in contact with the electronic element disposing region. A display area of the second display region is not less than an area of the electronic element disposing region and is fixed on the fixing member by the bending region after it is bent. Because of the first via hole on the display panel, the electronic element such as a camera, etc. is disposed under the display panel to realize full screen technology such as an under-display camera, etc. Meanwhile, because of the second display region, it can be realized that a region corresponding to the first via hole can still functionally display when the electronic elements are not in operation. This truly realizes a full screen display and solves the technical problem existing in current full screen technology that images cannot be displayed on a hole punching position.

In summary, although the present disclosure has disclosed the preferred embodiments as above, however the above-mentioned preferred embodiments are not to limit to the present disclosure. A person skilled in the art can make any change and modification, therefore the scope of protection of the present disclosure is subject to the scope defined by the claims.

What is claimed is:

1. A display module, comprising:
a display panel comprising a first display region and a second display region connected by a bending region;
a fixing member used to fix the second display region and guiding the second display region corresponding to the first display region to move;
wherein a first via hole is formed in an electronic element disposing region of the display panel, at least part of the first display region is in contact with the electronic element disposing region, and a display area of the second display region is not less than an area of the electronic element disposing region and is fixed on the fixing member by the bending region after it is bent.

2. The display module as claimed in claim 1, wherein the fixing member comprises a fixing chute and a pushing/pulling mechanism, the second display region is fixed in the fixing chute, and the pushing/pulling mechanism is used to push or pull the second display region to guide the second display region corresponding to the first display region to move.

3. The display module as claimed in claim 1, wherein the fixing member comprises a first supporting shaft and a second supporting shaft, the second display region is fixed on the first supporting shaft and the second supporting shaft, and the first supporting shaft rotates and the second supporting shaft translates to guide the second display region corresponding to the first display region to move.

4. The display module as claimed in claim 3, wherein the first supporting shaft is connected to the second display region by a transparent film material.

5. The display module as claimed in claim 3, wherein a second via hole is formed on the bending region of the display panel.

6. The display module as claimed in claim 1, wherein a signal line connected to the second display region is disposed on an edge of the bending region.

7. The display module as claimed in claim 6, wherein the signal line comprises at least one of a gate scanning line, a data line, a power line, or a grounding line.

8. The display module as claimed in claim 1, wherein a first alignment mark is disposed on the first display region, and a second alignment mark is disposed on the second display region.

9. The display module as claimed in claim 8, wherein the first alignment mark comprises a first display alignment terminal and a first non-display alignment terminal, and the second alignment mark comprises a second display alignment terminal and a second non-display alignment terminal.

10. A display device, comprising an electronic element and a display module, wherein the display module comprises:
a display panel comprising a first display region and a second display region connected by a bending region,
a first via hole formed in an electronic element disposing region of the display panel, at least part of the first display region in contact with the electronic element disposing region, and a display area of the second display region which is not less than an area of the electronic element disposing region; and a fixing member used to fix the second display region and guiding the second display region corresponding to the first display region to move, wherein the second display region is fixed on the fixing member by the bending region after it is bent;

wherein the electronic element is disposed under the first display region and the second display region, and wherein when the electronic element is working, the fixing member guides the second display region corresponding to the first display region to move to expose the first via hole, and when the electronic element is not working, the fixing member guides the second display region corresponding to the first display region to move to cover the first via hole and controls the second display region to work.

\* \* \* \* \*